US008140293B2

(12) United States Patent
Jeong et al.

(10) Patent No.: US 8,140,293 B2
(45) Date of Patent: Mar. 20, 2012

(54) ON DIE THERMAL SENSOR

(75) Inventors: Chun-Seok Jeong, Kyoungki-do (KR); Kee-Teok Park, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 1299 days.

(21) Appl. No.: 11/819,810

(22) Filed: Jun. 29, 2007

(65) Prior Publication Data

US 2008/0082290 A1   Apr. 3, 2008

(30) Foreign Application Priority Data

Sep. 28, 2006   (KR) .................. 10-2006-0095179

(51) Int. Cl.
 *G01K 7/00* (2006.01)
 *G01R 31/00* (2006.01)
(52) U.S. Cl. .......... 702/130; 702/99; 702/117; 702/127
(58) Field of Classification Search .............. 702/99, 702/117, 127, 130, 132, 134, 135; 327/83, 327/138, 262
 See application file for complete search history.

(56) References Cited

U.S. PATENT DOCUMENTS

| | | | | |
|---|---|---|---|---|
| 6,433,597 B2 * | 8/2002 | Jung | ............................. | 327/158 |
| 6,531,911 B1 * | 3/2003 | Hsu et al. | ...................... | 327/512 |
| 6,876,250 B2 | 4/2005 | Hsu et al. | | |
| 7,138,823 B2 | 11/2006 | Janzen et al. | | |
| 7,198,403 B2 * | 4/2007 | Proll et al. | ................... | 374/178 |
| 7,286,377 B1 * | 10/2007 | Pyeon | ............................. | 365/22 |
| 7,455,452 B2 * | 11/2008 | Seo | ................... | 702/99 |
| 2001/0009521 A1 * | 7/2001 | Hidaka | ......................... | 365/200 |
| 2004/0051569 A1 * | 3/2004 | Jeon | ............................. | 327/153 |
| 2005/0074051 A1 | 4/2005 | Won et al. | | |
| 2005/0141311 A1 * | 6/2005 | Kim et al. | ..................... | 365/222 |
| 2006/0002217 A1 | 1/2006 | Walker et al. | | |
| 2006/0056257 A1 * | 3/2006 | Origasa | ........................ | 365/222 |
| 2006/0111865 A1 * | 5/2006 | Choi | ............................ | 702/130 |
| 2006/0114734 A1 | 6/2006 | Cruz et al. | | |
| 2006/0158214 A1 | 7/2006 | Janzen et al. | | |
| 2007/0040574 A1 | 2/2007 | Janzen et al. | | |
| 2007/0098041 A1 * | 5/2007 | Seo | ........................... | 374/170 |
| 2008/0106321 A1 * | 5/2008 | Jeong et al. | .................. | 327/512 |

FOREIGN PATENT DOCUMENTS

| | | |
|---|---|---|
| CN | 1637942 A | 7/2005 |
| JP | 10-255467 | 9/1998 |
| KR | 2005-114938 | 12/2005 |
| KR | 2006-84572 | 7/2006 |
| KR | 10-652422 | 11/2006 |

OTHER PUBLICATIONS

Korean Notice of Allowance issued in Korean Patent Application No. KR 10-2006-0095179, dated Feb. 1, 2008.
Office Action issued from Chinese State Intellectual Property Office on Jul. 10, 2009 with an English Translation.
Notice of Preliminary Rejection issued from Taiwanese Intellectual Property Office on Nov. 26, 2010.

\* cited by examiner

*Primary Examiner* — Phuong Huynh
(74) *Attorney, Agent, or Firm* — IP & T Group LLP

(57) ABSTRACT

An on die thermal sensor (ODTS) for use in a semiconductor device includes a temperature information output unit for measuring an internal temperature of the semiconductor device to generate a temperature information code having temperature information, and updating the temperature information code according to a refresh period.

52 Claims, 9 Drawing Sheets

FIG. 9

| | TEMPERATURE | LOW | | | HIGH |
|---|---|---|---|---|---|
| TRIP_POINT_FLAG | TEMPA | L | H | H | H |
| | TEMPB | L | L | H | H |
| | TEMPC | L | L | L | H |
| | SELF_REFRESH_OSC PERIOD | 15% INCREASE | 5% INCREASE | UNCHANGED | 50% DECREASE |

ON DIE THERMAL SENSOR

CROSS-REFERENCE TO RELATED APPLICATIONS

The present invention claims priority of Korean patent application number 10-2006-0095179, filed on Sep. 28, 2006, which is incorporated by reference in its entirety.

BACKGROUND OF THE INVENTION

The present invention relates to updating temperature information of an on die thermal sensor (ODTS), and more particularly, to a temperature information output unit for updating temperature information of a semiconductor device according to a refresh period.

A dynamic random access memory (DRAM) cell includes a transistor for operating as a switch and a capacitor for storing a charge, i.e., data. According to whether the capacitor stores the charge, i.e., whether a terminal voltage of the capacitor is high or low, a logic level of the data is determined as a high level or a low level.

Since the data is stored in the capacitor as an accumulated electrical charge form, there is no power consumption for the data storage ideally. However, since there occurs a leakage current due to a PN junction of a metal oxide semiconductor (MOS) transistor, the stored initial charge may be discharged and, thus, the data may vanish.

To prevent data loss, the data stored in a memory cell is read and the read data is restored into the memory cell by recharging the memory cell with a normal charge before the data vanishes. This operation should be periodically performed in order to maintain data.

The above-mentioned recharging operation is called a refresh operation and, generally, a control of the refresh operation is performed by a DRAM controller. Due to the refresh operation, refresh power is consumed. In case of a battery operated system, which requires lower power consumption, reducing power consumption is very important and is a critical issue.

One method of reducing the power consumption for the refresh operation is changing a refresh period according to temperature. As the temperature decreases, a data holding time of the DRAM becomes longer. Therefore, by dividing a temperature range into several temperature regions and by lowering a frequency of a refresh clock at a relative low temperature region, power consumption is reduced.

Accordingly, a device for correctly sensing the temperature of the inside of the DRAM and for adjusting the refresh clock frequency is required.

As a semiconductor unit is highly integrated and is operated at a higher speed, a significant amount of heat is generated. The generated heat increases internal temperature of the semiconductor unit and, thus, can prevent the semiconductor unit from normally operating. The generated heat may cause a defect in the semiconductor unit.

Therefore, a device for correctly sensing the temperature of the semiconductor unit and for outputting the sensed temperature information is needed.

FIG. 1 is a block diagram of a conventional on die thermal sensor (ODTS) for use in a semiconductor device.

The conventional ODTS 1 includes a temperature sensing unit 2, an analog-to-digital converting unit 3, a temperature information converting unit 4, and an operating controller 5.

The temperature sensing unit 2 detects an internal temperature of the semiconductor device and generates a temperature voltage VTEMP according to the detected internal temperature. Further, the temperature sensing unit 2 outputs first and second variation voltages VULIMIT and VLLIMIT, which are upper and lower limits of the temperature voltage VTEMP, respectively.

The analog-to-digital converting unit 3 converts the temperature voltage VTEMP into a measuring temperature code DIGITAL_CODE having a digital value, and outputs an internal update signal IN_UPDATE.

The temperature information converting unit 4 performs a preset operation and converts the measuring temperature code DIGITAL_CODE into a temperature information code $TEMP_{13}$ CODE and a plurality of flag signals TRIP_POINT_FLAG<0:M>, M being a positive integer, to output them with an update signal UPDATE in response to the internal update signal IN_UPDATE.

The operating controller 5 controls an operation on a normal mode of the ODTS 1 by receiving an impedance matching command ZQCAL_CMD from a memory register set (MRS) (not shown), controls an operation on a self-refresh mode of the ODTS 1 by receiving a self-refresh signal SREF, and controls an operation on a test mode of the ODTS 1 by receiving a test enable signal TEST_ENABLE.

A code storage unit 6 located at outside of the ODTS 1 stores the temperature information code TEMP_CODE in response to the update signal UPDATE. A memory controller can change a refresh period of the semiconductor device by reading the temperature information code TEMP_CODE stored by the code storage unit 6.

A self-refresh oscillation unit 7 located at outside of the ODTS 1 operates in the self-refresh mode and changes a self-refresh period of the semiconductor device in response to the plurality of flag signals TRIP_POINT_FLAG<0:M>.

An impedance matching unit 8 located at outside of the ODTS 1 operates under the control of the impedance matching command ZQCAL_CMD though the impedance matching unit 8 operates without regard to the ODTS 1.

FIG. 2 is a timing diagram showing an initialization operation of the conventional ODTS.

Hereinafter, referring to FIGS. 1 and 2, a sequence of the initialization operation of the conventional ODTS 1 is explained in detail.

First, if the impedance matching command ZQCAL_CMD is toggled, the initialization operation of the ODTS I starts.

Second, the operating controller 5 of the ODTS 1 activates a first operating control signal BGR_ON in response to the impedance matching command ZQCAL_CMD.

Third, the temperature sensing unit 2 initializes voltage levels of the temperature voltage VTEMP, and the first and second variation voltages VULIMIT and VLLIMIT in response to the first operating control signal BGR_ON. Herein, an activation time of the first operating control signal BGR_ON is preset by the operating controller 5.

Fourth, after finishing initializing the voltage levels of the temperature voltage VTEMP, and the first and second variation voltages VULIMIT and VLLIMIT of the temperature sensing unit 2, the operating controller 5 activates a second operating control signal ACT_ON.

Fifth, the analog-to-digital converting unit 3 of the ODTS 1 starts converting the temperature voltage VTEMP into the measuring temperature code DIGITAL_CODE as a digital value in response to the second operating control signal ACT_ON. The converting is repeatedly performed and the internal update signal IN_UPDATE is toggled with every converting. Herein, an activation time of the second operating control signal ACT_ON is preset by the operating controller 5.

Sixth, the temperature information converting unit 4 of the ODTS 1 converts the measuring temperature code DIGITAL_CODE into the temperature information code TEMP_CODE and the plurality of flag signals TRIP_POINT_FLAG<0:M>. The temperature information converting unit 4 drives the temperature information code TEMP_CODE and the update signal UPDATE in response to a toggling of the internal update signal IN_UPDATE. The temperature information converting unit 4 updates the temperature information code TEMP_CODE stored in the code storage unit 6 in response to the update signal UPDATE.

Further, each voltage level of the plurality of flag signals TRIP_POINT_FLAG<0:M> varies and is outputted according to the measuring temperature code DIGITAL_CODE regardless of toggling of the internal update signal IN_UPDATE. The temperature information converting unit 4 provides the self-refresh oscillation unit 7 operating in the self-refresh mode with the plurality of flag signals TRIP_POINT_FLAG<0:M> having temperature information so that the self-refresh period of the semiconductor device varies in response to the temperature.

Seventh, after the first and second operating control signals BGR_ON and ACT_ON are sequentially inactivated, the initialization operation of the ODTS 1 is finished.

The ODTS 1 updates the temperature information of the semiconductor device by repeatedly performing operations of the first step to the seventh step whenever the impedance matching command ZQCAL_CMD is toggled.

The impedance matching command ZQCAL_CMD is an output signal from the memory controller to the impedance matching unit 8 for matching impedances between input/output pins to transmit/receive data to/from the semiconductor device and transmission lines coupled to the input/output pins.

TABLE 1

| Symbol | DDR3 800/1066/1333/1600 | | |
|---|---|---|---|
| | Min | Max | Units |
| tZQOper (formerly tZQXSR) | 256 | NA | tCK |
| tZQInit (formerly tZQCL) | 512 | NA | tCK |
| tZQCS | 64 | NA | tCK |

Table. 1 shows the impedance matching command ZQCAL_CMD specified in a specification of a double data rate III (DDR3) dynamic random access memory (DRAM) device manufactured by Intel Corporation.

Referring to Table. 1, the DRAM device cannot read and write data through the input/output pins for a predetermined time after the impedance matching command ZQCAL_CMD is inputted because the impedance matching command ZQCAL_CMD is used for matching impedances between the input/output pins and the transmission lines.

As a result, a bandwidth efficiency of the data input and output through the input/output pins is deteriorated. Accordingly, the DRAM device has a good performance when the impedance matching command ZQCAL_CMD is inputted at an interval of time as long as possible.

However, in the conventional ODTS 1, it is advantageous to update the temperature information at an interval of time as short as possible. That is, it is possible to accurately measure a temperature of the semiconductor device when the impedance matching command ZQCAL_CMD is frequently inputted at an interval of time as short as possible.

An update period of the temperature information of the ODTS 1 and an input period of the impedance matching command ZQCAL_CMD can be different from each other. This is because update period of the temperature information of the ODTS 1 varies according to the internal temperature of the DRAM device and the input period of the impedance matching command ZQCAL_CMD varies according to power noise of the DRAM device as well as the internal temperature of the DRAM device.

However, it is difficult for the conventional ODTS 1 to optimize each of the update period of the temperature information of the ODTS 1 and the input period of the impedance matching command ZQCAL_CMD because the conventional ODTS 1 updates the temperature information in response to the impedance matching command ZQCAL_CMD. As a result, the conventional ODTS 1 is difficult to perform an efficient operation.

SUMMARY OF THE INVENTION

Embodiments of the present invention are directed to an on die thermal sensor (ODTS) for correctly updating temperature information regardless of an operation mode of a dynamic random access memory (DRAM) by updating the temperature information of a semiconductor device according to a refresh period.

In accordance with an aspect of the present invention, there is provided an on die thermal sensor (ODTS) for use in a semiconductor device, including a temperature information output unit for measuring an internal temperature of the semiconductor device to generate a temperature information code having temperature information, and updating the temperature information code according to a refresh period.

In accordance with another aspect of the present invention, there is provided a semiconductor device, including: a temperature information output unit for measuring an internal temperature of the semiconductor device to generate a temperature information code and a plurality of flag signals, and updating the temperature information code in response to a refresh command signal in a normal mode and a self-refresh oscillation signal in a self-refresh mode; a code storage unit for storing the temperature information code when the temperature information code is updated; a memory controller for changing a period of the refresh command signal by reading the temperature information code stored in the code storage unit; and a self-refresh oscillation unit for changing a period of the self-refresh oscillation signal in response to the plurality of flag signals.

BRIEF DESCRIPTION OF THE DRAWINGS

FIG. 9 is a timing diagram illustrating a relationship between a plurality of flag signals outputted from a flag signal output unit shown in FIG. 8 and a self-refresh oscillation signal.

DESCRIPTION OF SPECIFIC EMBODIMENTS

It is an object of the present invention to provide an on die thermal sensor (ODTS) for updating temperature information according to a refresh period.

Hereinafter, the ODTS in accordance with the present invention will be described in detail referring to the accompanying drawings.

Figure 1:
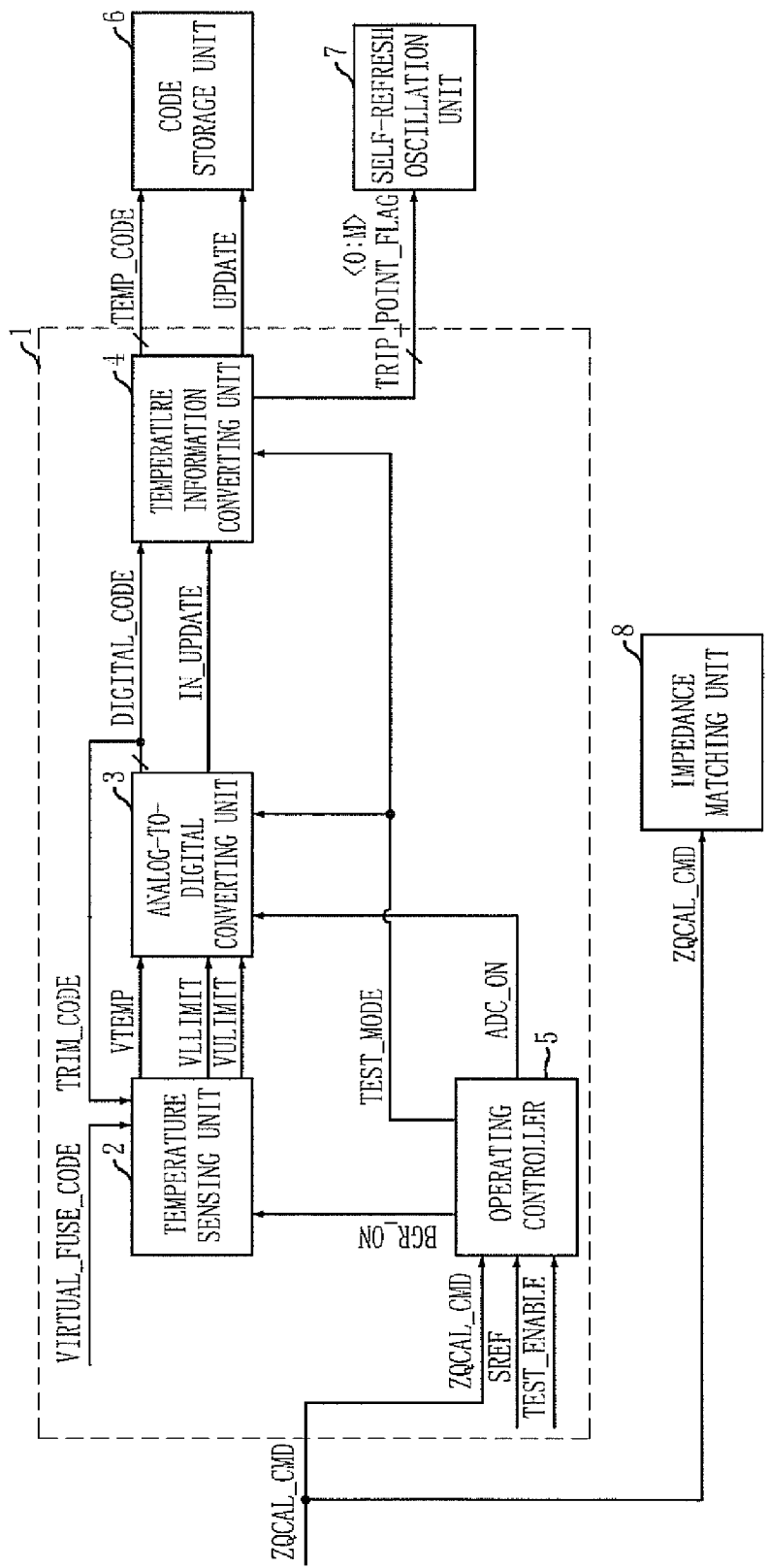
FIG. 1 is a block diagram of a conventional on die thermal sensor (ODTS) for use in a semiconductor device.
Figure 2:
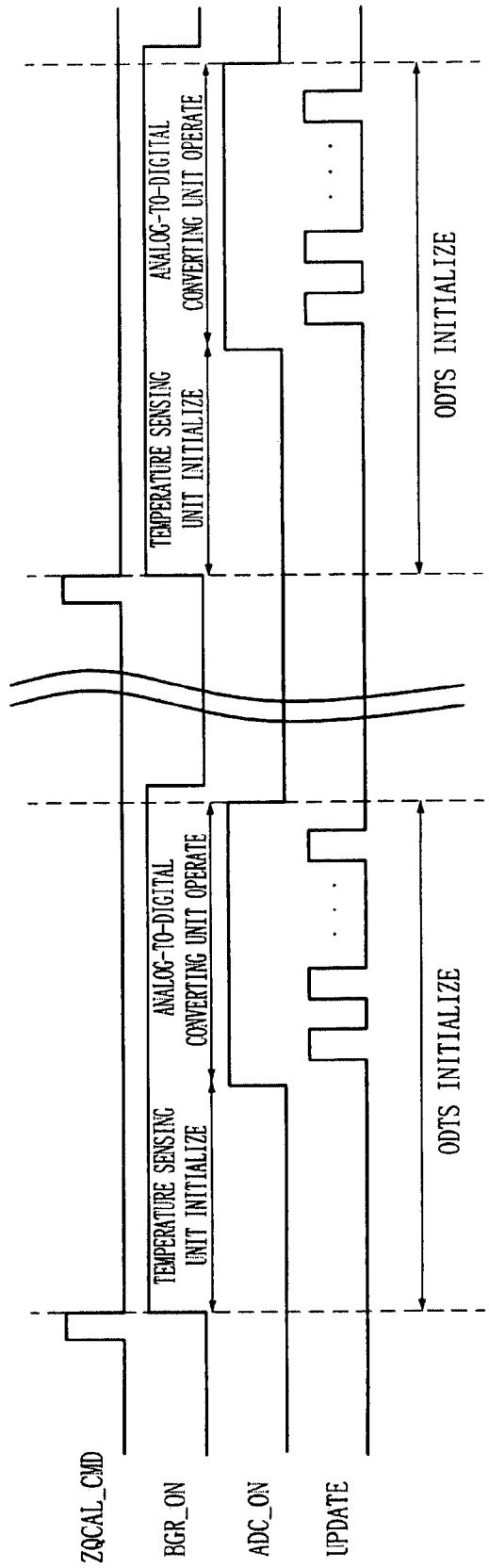
FIG. 2 is a timing diagram showing an operation of the conventional ODTS.
Figure 3:
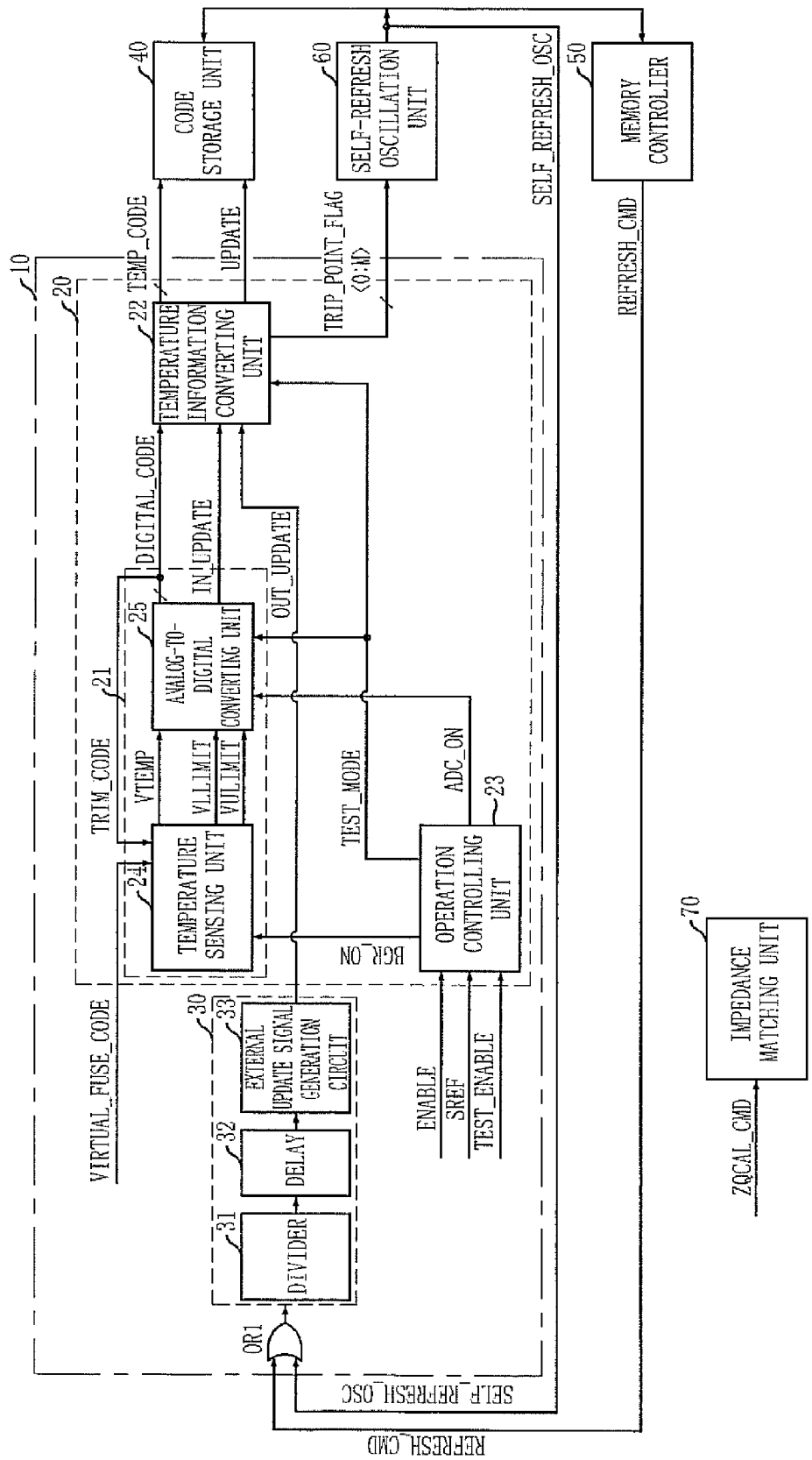
FIG. 3 is a block diagram of an ODTS for use in a semiconductor device in accordance with an embodiment of the present invention.

FIG. 3 is a block diagram of an ODTS for use in a semiconductor device in accordance with an embodiment of the present invention.

The ODTS of the present invention includes a temperature information output unit 10 which generates temperature information by measuring an internal temperature of the semiconductor device, and updates the temperature information according to a refresh period.

In detail, the temperature information output unit 10 includes a temperature information code generation unit 20 and an external update signal output unit 30.

The temperature information code generation unit 20 measures the internal temperature of the semiconductor device to generate a temperature information code TEMP_CODE and a plurality of flag signals TRIP_POINT_FLAG<0:M>, M being a positive integer. Herein, the temperature information code TEMP_CODE shows the measured temperature as a binary code with a sign, and each voltage level of the plurality of flag signals TRIP_POINT_FLAG<0:M> varies according to the measured temperature.

The external update signal output unit 30 outputs an external update signal OUT_UPDATE in response to a refresh command signal REFRESH_CMD in a normal mode and a self-refresh oscillation signal SELF_REFRESH_OSC in a self-refresh mode so that the temperature information code generation unit 20 updates the temperature information code TEMP_CODE.

For reference, a period of the refresh command signal REFRESH_CMD varies according to the temperature information code TEMP_CODE, and a period of the self-refresh oscillation signal SELF_REFRESH_OSC varies according to the number of activated ones of the plurality of flag signals TRIP_POINT_FLAG<0:M>.

The temperature information code generation unit 20 includes a temperature measuring unit 21, a temperature information converting unit 22, and an operation controlling unit 23. The temperature measuring unit 21 measures the internal temperature of the semiconductor device to output a measuring temperature code DIGITAL_CODE having information relating to the measured temperature, and an internal update signal IN_UPDATE informing an update of the measuring temperature code DIGITAL_CODE. The temperature information converting unit 22 performs a preset operation to convert the measuring temperature code DIGITAL_CODE into the temperature information code TEMP_CODE and the plurality of flag signals TRIP_POINT_FLAG<0:M>and output the temperature information code TEMP_CODE with an update signal UPDATE in response to the internal update signal IN_UPDATE or the external update signal OUT_UPDATE. The operation controlling unit 23 receives an enable signal ENABLE, a test mode enable signal TEST_ENABLE, and a self-refresh signal SREF to generate first and second operating control signals BGR_ON and ADC_ON for controlling an operating mode of the temperature measuring unit 21 and to generate a test mode signal TEST_MODE for controlling an operating mode of the temperature information converting unit 22. The enable signal ENABLE controls an entry of the normal mode of the temperature information output unit 10, the test mode enable signal TEST_ENABLE controls an entry of a test mode, and the self-refresh signal SREF controls an entry of the self-refresh mode.

The external update signal output unit 30 includes a divider 31, a delay 32 and an external update signal generation unit 33. The divider 31 divides each input period of the refresh command signal REFRESH_CMD in the normal mode and the self-refresh oscillation signal SELF_REFRESH_OSC in the self-refresh mode by N, N being positive integers. The delay 32 delays an output of the divider by a predetermined time. The external update signal generation unit 33 generates the external update signal OUT_UPDATE in response to an output of the delay 32.

The external update signal output unit 30 further includes an OR gate OR1 performing an OR operation on the refresh command signal REFRESH_CMD and the self-refresh oscillation signal SELF_REFRESH_OSC to output a result to the divider 31.

The reason why the refresh period, i.e., the period of the refresh command signal REFRESH_CMD or the period of the self-refresh oscillation signal SELF_REFRESH_OSC, is divided by N is that the refresh period is different from an update period of the temperature information output unit 10. Namely, the temperature information output unit 10 can update the temperature information code TEMP_CODE with every optimum time by dividing the refresh period by N.

When a semiconductor device performs a refresh operation, noises at a power supply voltage VDD and a ground voltage VSS of the semiconductor device suddenly increases because a plurality of memory cells are refreshed at the same time. Accordingly, in the present invention, the external update signal OUT_UPDATE is outputted by delaying the output of the divider 31 by the predetermined time, and thus it is possible to minimize the noises at the power supply voltage VDD and the ground voltage VSS of the semiconductor device by updating the temperature information after finishing the refresh operation.

Further, an activation section of the output of the delay 21 can be different from that of a signal required for updating the temperature information code TEMP_CODE outputted from the temperature information converting unit 22. Accordingly, the external update signal generation unit 33 generates the external update signal OUT_UPDATE having a proper activation section for updating the temperature information code TEMP_CODE in response to the output of the delay 32. For example, the external update signal generation unit 33 can detect a signal toggled in synchronization with a rising edge or a falling edge of the output of the delay 32 to output the signal as the external update signal OUT_UPDATE.

The temperature measuring unit 21 includes a temperature sensing unit 24 and an analog-to-digital converting unit 25.

The temperature sensing unit 24 generates a temperature voltage VTEMP and first and second variation voltages VULIMIT and VLLIMIT. The temperature voltage VTEMP decreases as the internal temperature increases. Each of the first and second variation voltages VULIMIT and VLLIMIT has a constant voltage level regardless of a temperature variation. The analog-to-digital converting unit 25 converts the temperature voltage VTEMP having an analog value and outputs the measuring temperature code DIGITAL_CODE having a digital value and the internal update signal IN_UPDATE in response to the first and second variation voltages VULIMIT and VLLIMIT.

Furthermore, a code storage unit 40, a memory controller 50, and a self-refresh oscillation unit 60 are located at outside of the temperature information output unit 10. The code storage unit 40 stores the temperature information code TEMP_CODE when the temperature information code TEMP_CODE is updated. The memory controller 50 changes the period of the refresh command signal REFRESH_CMD by reading the temperature information code TEMP_CODE stored in the code storage unit 40. The self-refresh oscillation unit 60 changes the period of the self-refresh oscillation signal SELF_REFRESH_OSC in response to the plurality of flag signals TRIP_POINT_FLAG<0:M>.

The code storage unit 40 includes a multi-purpose register for receiving the update signal UPDATE as a first input and the temperature information code TEMP_CODE as a second input so as to store the temperature information code TEMP_CODE when the update signal UPDATE is activated.

As described above, the conventional ODTS updates temperature information in response to an impedance matching command ZQCAL_CMD. As compared with the conventional ODTS, the ODTS in accordance with the embodiment of the present invention updates temperature information in response to the refresh period, i.e., the period of the refresh command signal REFRESH_CMD in the normal mode or the period of the self-refresh oscillation signal SELF_REFRESH_OSC in the self-refresh mode. Accordingly, in the present invention, the impedance matching command ZQCAL_CMD is only inputted to an impedance matching unit 70, and thus the ODTS operates independently of the impedance matching unit 70.

Figure 4:
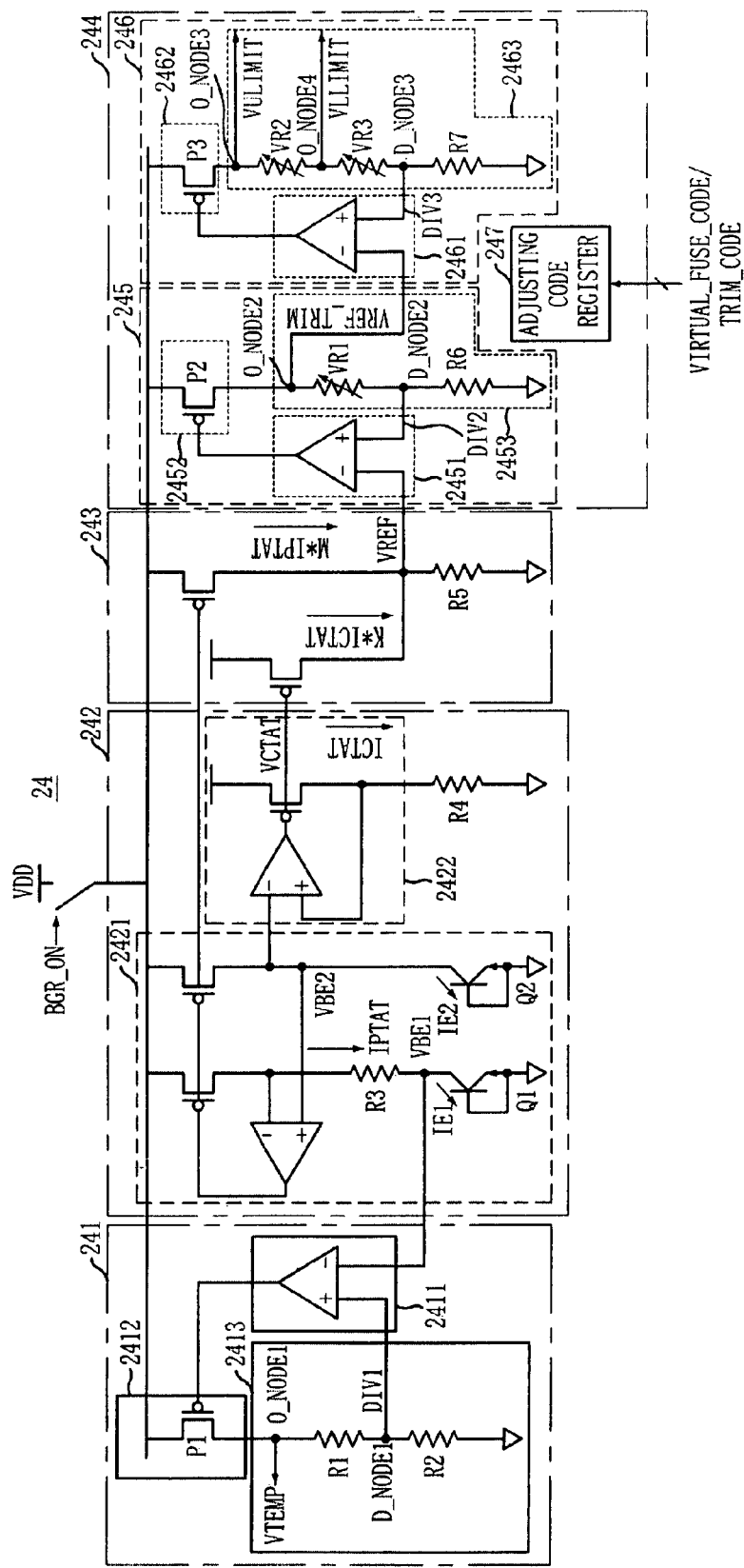
FIG. 4 is a detailed block diagram of a temperature sensing unit of the ODTS shown in FIG. 3.

FIG. 4 is a detailed block diagram of the temperature sensing unit 24 of the ODTS shown in FIG. 3.

The temperature sensing unit 24 includes a voltage amplifying unit 241, a current generating unit 242, a reference voltage generating unit 243, and a voltage level adjusting unit 244.

The voltage amplifying unit 241 amplifies a first base-emitter voltage VBE1 to output it as the temperature voltage VTEMP. The first base-emitter voltage VBE1 is proportioned to a first emitter current IE1 of a first bipolar junction transistor (BJT) Q1 and decreases as the internal temperature increases. The current generating unit 242 generates a first current IPTAT which increases as the internal temperature increases and a second current ICTAT which decreases as the internal temperature increases. The reference voltage generating unit 243 generates a reference voltage VREF which has a constant voltage level regardless of a temperature variation and is proportioned to a third current generated by summing the first and second current with a preset ratio, e.g., a value of M*IPTAT+K*ICTAT, M and K being an integers. The voltage level adjusting unit 244 determines voltage levels of the first and second variation voltages VULIMIT and VLLIMIT by adjusting a voltage level of the reference voltage VREF in response to an adjusting code VIRTUAL_FUSE_CODE/TRIM_CODE.

In detail, the voltage amplifying unit 241 includes a first differential amplifier 2411, a first driver 2412, and a first divider 2413.

The first differential amplifier 2411 receives the first base-emitter voltage VBE1 as a negative input (−) and a first dividing voltage DIV1 as a positive input (+) to amplify and output the inputs. The first driver 2412 drives the temperature voltage VTEMP in response to an output of the first differential amplifier 2411. The first divider 2413 divides a voltage level of the temperature voltage VTEMP by a preset value to thereby determine a voltage level of the first dividing voltage DIV1.

The first driver 2412 includes a first PMOS transistor P1 for driving a power supply voltage VDD coupled to its source into its drain as the temperature voltage VTEMP in response to the output of the first differential amplifier 2411 coupled to its gate.

The first divider 2413 includes first and second resistors R1 and R2 having preset resistances between a temperature voltage output node O_NODE1 and a ground voltage VSS. The first dividing voltage DIV1 is outputted at a common node D_NODE1 of the first and second resistors R1 and R2.

The current generating unit 242 includes a first current generating unit 2421 and a second current generating unit 2422.

The first current generating unit 2421 generates the first current IPTAT by providing a third resistor R3 having a preset resistance with the first base-emitter voltage VBE1 in proportion to the first emitter current IE1 of the first BJT Q1. The second current generating unit 2422 forms a cascade connection with the first current generating unit 2421 and generates the second current ICTAT by providing a fourth resistor R4 having a preset resistance with a second base-emitter voltage VBE2 in proportion to a second emitter current IE2 of a second BJT Q2. Herein, the first emitter current IE1 of the first BJT Q1 has N times of the second emitter current IE2 of the second BJT Q2.

The reference voltage generating unit 243 generates the reference voltage VREF by providing a fifth resistor R5 having a preset resistance with the third current generated by summing M times of the first current (M*IPTAT) and N time of the second current (K*ICTAT).

The voltage level adjusting unit 244 includes first and second adjusting units 245 and 246, and an adjusting code register 247.

The first adjusting unit 245 outputs an adjusting reference voltage VREF_TRIM by adjusting the voltage level of the reference voltage VREF. A voltage level of the adjusting reference voltage VREF_TRIM is determined according to the adjusting code VIRTUAL_FUSE_CODE/TRIM_CODE. The second adjusting unit 246 outputs the first and second variation voltages VULIMIT and VLLIMIT by adjusting the voltage level of the adjusting reference voltage VREF_TRIM. Each voltage level of the first and second variation voltages VULIMIT and VLLIMIT is determined according to the adjusting code VIRTUAL_FUSE_CODE/TRIM_CODE, and varies with a uniform difference. The adjusting code register 247 stores the adjusting code VIRTUAL_FUSE_CODE/TRIM_CODE to transmit them to the first and second adjusting units 245 and 246.

In detail, the first adjusting unit 245 includes a second differential amplifier 2451, a second driver 2452, and a second divider 2453.

The second differential amplifier 2451 receives the reference voltage VREF as a negative input (−) and a second dividing voltage DIV2 as a positive input (+) to amplify and output the inputs. The second driver 2452 drives the adjusting reference voltage VREF_TRIM in response to an output of the second differential amplifier 2451. The second divider 2453 divides the voltage level of the adjusting reference voltage VREF_TRIM by a preset value to thereby determine a voltage level of the second dividing voltage DIV2.

The second driver 2452 includes a second PMOS transistor P2 for driving the power supply voltage VDD coupled to its source to its drain as the adjusting reference voltage VREF_T-

RIM in response to the output of the second differential amplifier 2451 coupled to its gate.

The second divider 2453 includes a first variable resistor VR1 having a variable resistance according to the adjusting code VIRTUAL_FUSE_CODE/TRIM_CODE, and a sixth resistor R6 having a preset resistance between an adjusting-reference voltage output node O_NODE2 and the ground voltage VSS. The second dividing voltage DIV2 is outputted at a common node D_NODE2 of the first variable resistor VR1 and the sixth resistor R6.

Further, the second adjusting unit 246 includes a third differential amplifier 2461, a third driver 2462, and a third divider 2463.

The third differential amplifier 2461 receives the adjusting reference voltage VREF_TRIM as a negative input (−) and a third dividing voltage DIV3 as a positive input (+) to amplify and output the inputs. The third driver 2462 drives the first variation voltage VULIMIT in response to an output of the third differential amplifier 2461. The third divider 2463 divides the voltage level of the first variation voltage VULIMIT by a preset value to thereby determine each voltage level of the second variation voltage VLLIMIT and the third dividing voltage DIV3.

The third driver 2462 includes a third PMOS transistor P3 for driving the power supply voltage VDD coupled to its source to its drain as the first variation voltage VULIMIT in response to the output of the third differential amplifier 2461 coupled to its gate.

The third divider 2463 includes second and third variable resistors VR2 and VR3 having variable resistances according to the adjusting code VIRTUAL_FUSE_CODE/TRIM_CODE, and a seventh resistor R7 having a preset resistance between a first variation voltage output node O_NODE3 and the ground voltage VSS. The second variation voltage VLLIMIT is outputted at a common node O_NODE4 of the second and third variable resistors VR2 and VR3, and the third dividing voltage DIV3 is outputted at a common node D_NODE3 of the third variable resistor VR3 and the seventh resistor R7.

The adjusting code VIRTUAL_FUSE_CODE/TRIM_CODE is a trimming code TRIM_CODE generated by receiving the measuring temperature code DIGITAL_CODE in the test mode, and is a fuse code VIRTUAL_FUSE_CODE in the normal and self-refresh modes.

Figure 5:
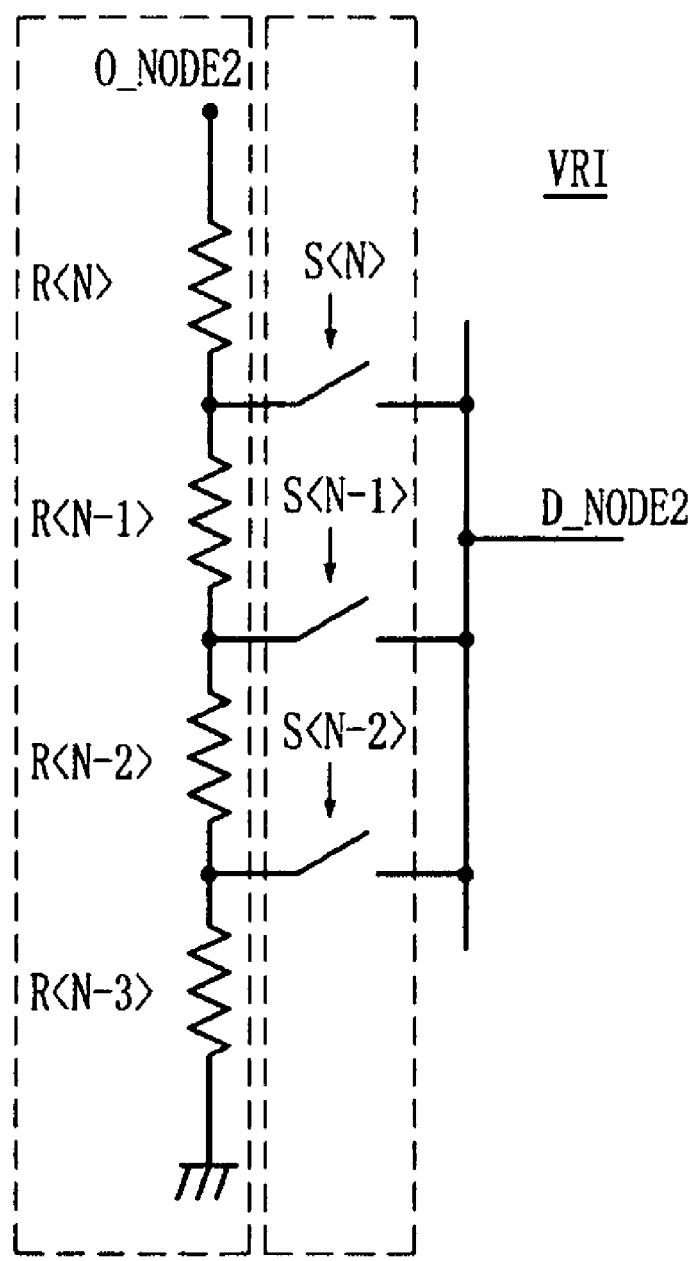
FIG. 5 is a detailed block diagram of a variable resistor of the temperature sensing unit shown in FIG. 4.

FIG. 5 is the first variable resistor VR1 of the temperature sensing unit 24 shown in FIG. 4. Herein, the second and third variable resistors VR2 and VR3 have substantially the same structures as that of the first variable resistor VR1.

The first variable resistor VR1 includes a plurality of resistors R<N>, R<N-1>, R<N-2> . . . and a plurality of switches S<N>, S<N-1>, S<N-2> . . . . Each of the plurality of resistors R<N>, R<N-1>, R<N-2> . . . is connected in series and has a preset resistance. Each of the plurality of switches S<N>, S<N-1>, S<N-2> . . . forms an one-to-one connection with each of resistors R<N>, R<N-1>, R<N-2> . . . in parallel and is controlled according to the adjusting code VIRTUAL_FUSE_CODE/TRIM_CODE.

Figure 6:
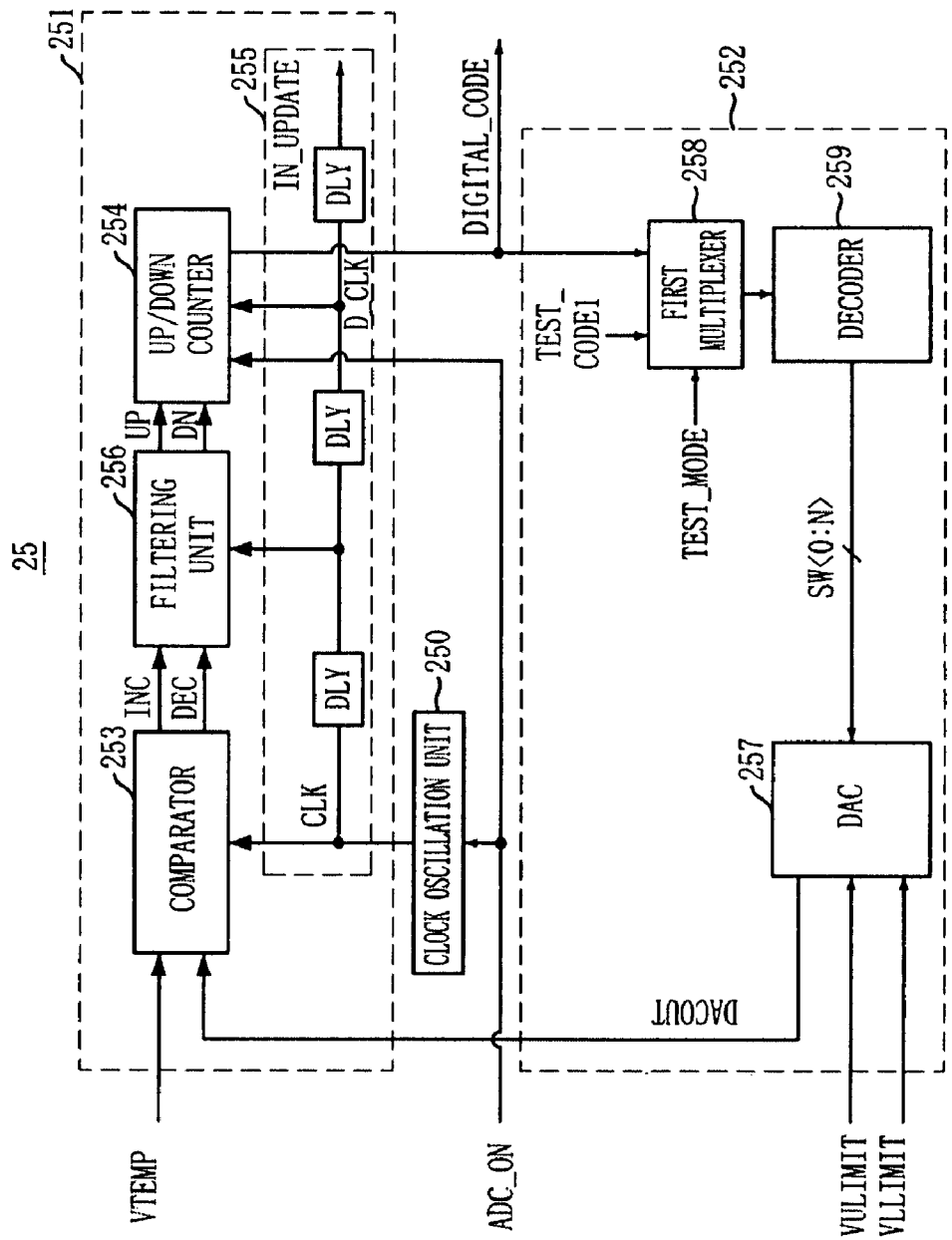
FIG. 6 is a detailed block diagram of an analog-to-digital converting unit of the ODTS shown in FIG. 3.

FIG. 6 is a detailed block diagram of the analog-to-digital converting unit 25 of the ODTS shown in FIG. 3.

The analog-to-digital converting unit 25 includes a clock oscillation unit 250, a comparison unit 251, and a voltage level determination unit 252.

The clock oscillation unit 250 oscillates a clock signal CLK in response to the second operating control signal ACT_ON outputted from the operation controlling unit 23. The comparison unit 251 compares the voltage level of the temperature voltage VTEMP with that of a tracking voltage DACOUT and decreases or increases the measuring temperature code DIGITAL_CODE according to the result of comparison to output it with the internal update signal IN_UPDATE under the control of the clock signal CLK. The voltage level determination unit 252 determines the voltage level of the tracking voltage DACOUT based on the measuring temperature code DIGITAL_CODE in the normal mode or a first test code TEST_CODE1 in the test mode. Herein, the voltage level of the tracking voltage DACOUT is lower than that of the first variation voltage VULIMIT and is higher than that of the second variation voltage VLLIMIT.

In detail, the comparison unit 251 includes a comparator 253, an up/down counter 254, an internal update signal output unit 255, and a filtering unit 256.

The comparator 253 compares the voltage level of the temperature voltage VTEMP with that of the tracking voltage DACOUT in response to the clock signal CLK to thereby determine an increase signal INC and a decrease signal DEC under the control of the result of comparison. The up-down counter 254 decreases or increases the measuring temperature code DIGITAL_CODE according to the increase signal INC and the decrease signal DEC under the control of a first delay-clock D_CLK generated by delaying the clock signal CLK by a predetermined time. The internal update signal output unit 255 delays the clock signal CLK by a preset time to output the internal update signal IN_UPDATE. The filtering unit 256 prevents the up/down counter 254 from performing a wrong operation by filtering the increase and the decrease signals INC and DEC.

The voltage level determination unit 252 includes a digital-to-analog converter (DAC) 257, a first multiplexer 258, and a decoder 259.

The DAC 257 converts an adjusted information code SW<0:N>, N being a positive integer, having a digital value into the tracking voltage DACOUT having an analog value in response to the first and second variation voltages VULIMIT and VLLIMIT. The first multiplexer 258 selects one of the measuring temperature code DIGITAL_CODE and the first test code TEST_CODE1 in response to the test mode signal TEST_MODE outputted from the operation controlling unit 23. That is, the first multiplexer 258 selects the measuring temperature code DIGITAL_CODE in the normal mode and the first test code TEST_CODE1 in the test mode. The decoder 259 decodes outputs of the first multiplexer 258 to transmit the adjusted information code SW<0:N>to the DAC 257.

For reference, the first test code TEST_CODE1 is a preset digital value within the analog-to-digital converting unit 25. Namely, the first test code TEST_CODE1 set by a user is determined according to test conditions so as to be stored within the analog-to-digital converting unit 25.

Figure 7:
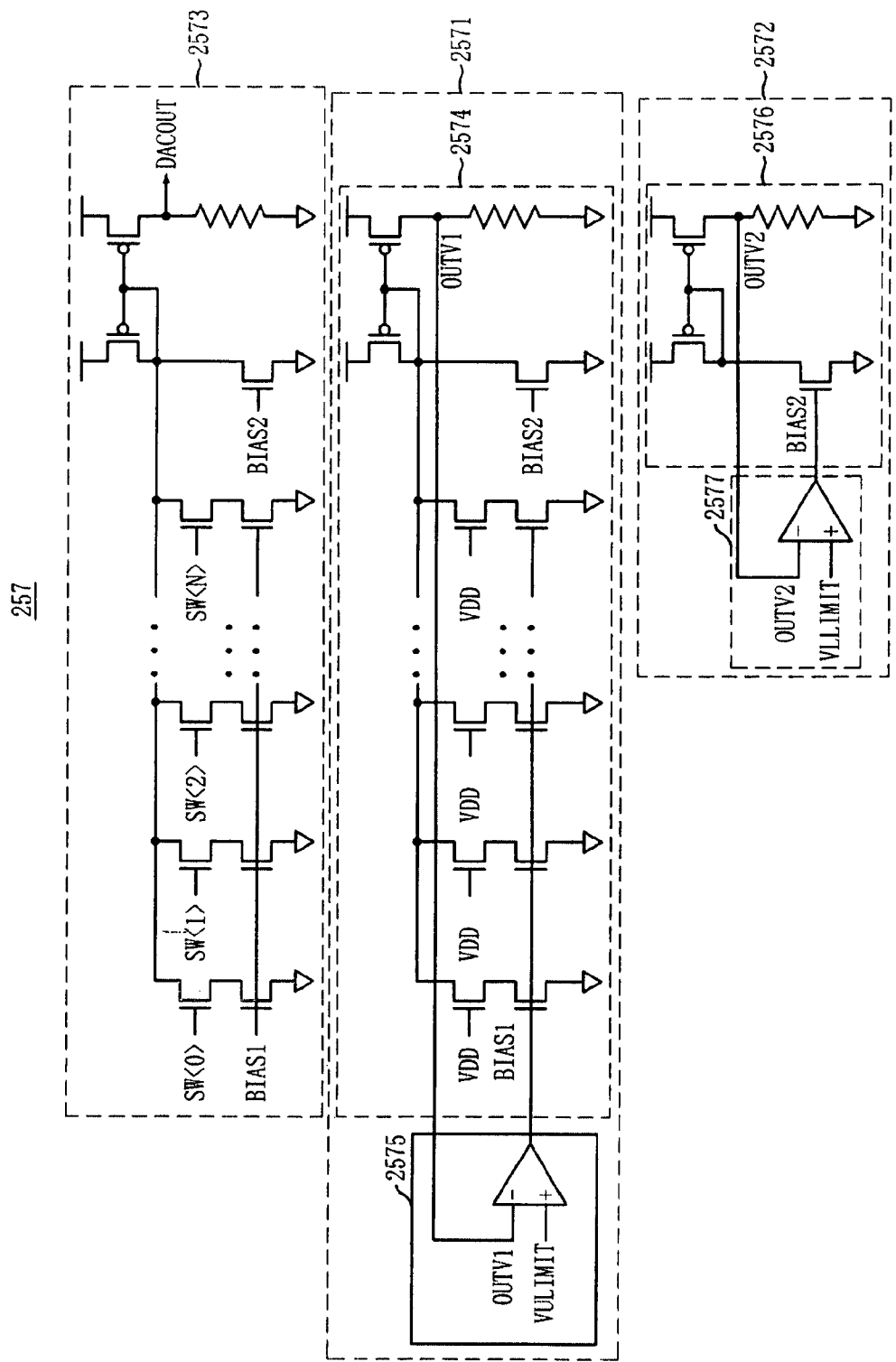
FIG. 7 is a detailed block diagram of a digital-to-analog converter (DAC) of the analog-to-digital converting unit shown in FIG. 6.

FIG. 7 is a detailed block diagram of the digital-to-analog converter (DAC) 257 of the analog-to-digital converting unit 25 shown in FIG. 6.

The DAC 257 includes a first bias determination unit 2571, a second bias determination unit 2572, and a tracking voltage output unit 2573.

The first bias determination unit 2571 determines a voltage level of a first bias voltage BIAS1 by comparing a first output voltage OUTV1 with the first variation voltage VULIMIT. The voltage level of the first output voltage OUTV1 is controlled by the voltage level of the first bias voltage BIAS1.

The second bias determination unit 2572 determines a voltage level of a second bias voltage BIAS2 by comparing a second output voltage OUTV2 with the second variation voltage VLLIMIT. The voltage level of the second output voltage OUTV2 is controlled by the voltage level of the second bias voltage BIAS2.

The tracking voltage output unit 2573 is enabled under the control of the adjusted information code SW<0:N> to thereby determine the voltage level of the tracking voltage DACOUT based on the first and second bias voltages BIAS1 and BIAS2 outputted from the first and second bias determination units 2571 and 2572.

In detail, the first bias determination unit 2571 includes a first current mirror circuit 2574 and a first comparator 2575. The first current mirror circuit 2574 determines the voltage level of the first output voltage OUTV1 based on the first bias voltage BIAS1. The first comparator 2575 outputs the first bias voltage BIAS1 by comparing the first output voltage OUTV1 with the first variation voltage VULIMIT.

The second bias determination unit 2572 includes a second current mirror circuit 2576 and a second comparator 2577. The second current mirror circuit 2576 determines the voltage level of the second output voltage OUTV2 based on the second bias voltage BIAS2. The second comparator 2577 outputs the second bias voltage BIAS2 by comparing the second output voltage OUTV2 with the second variation voltage VULIMIT.

The tracking voltage determination unit 2573 includes a third current mirror circuit which is enabled under the control of the adjusted information code SW<0:N>, i.e., SW<0>, SW<1> to SW<N>, and determines the voltage level of the tracking voltage DACOUT based on the first and second bias voltages BIAS1 and BIAS2. For reference, the adjusted information code SW<0:N> can be the measuring temperature code DIGITAL_CODE in the normal mode and the first test code TEST_CODE1 in the test mode.

Figure 8:
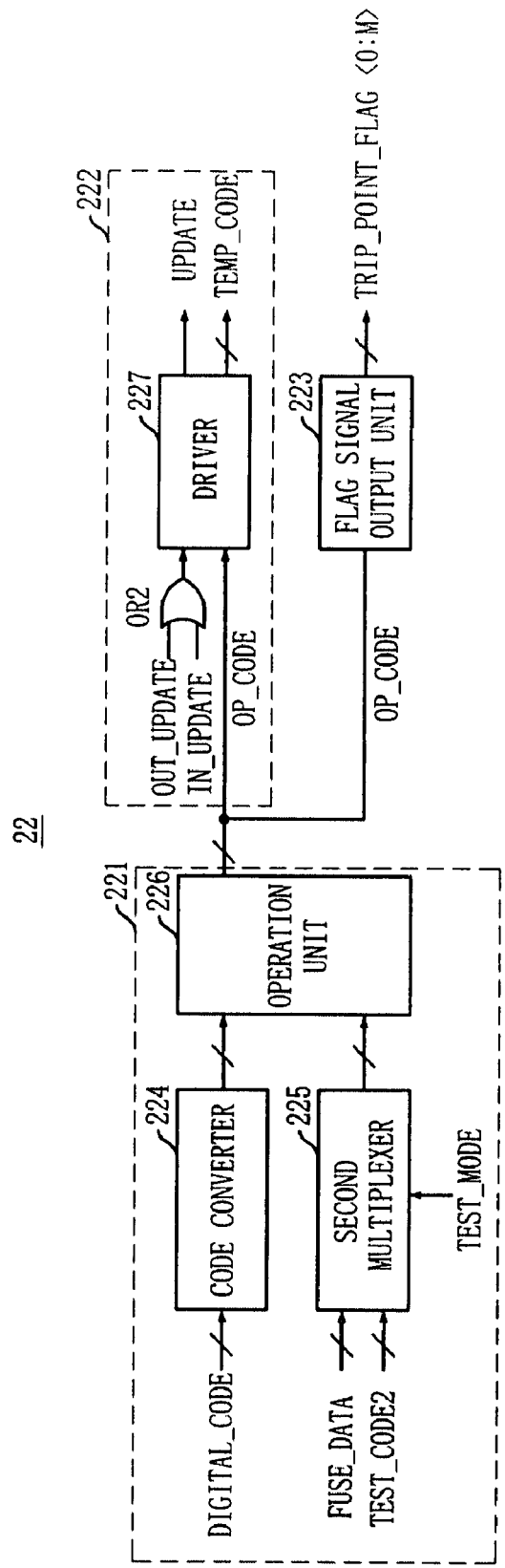
FIG. 8 is a detailed block diagram of a temperature information converting unit of the ODTS shown in FIG. 3.

FIG. 8 is a detailed block diagram of the temperature information converting unit 22 of the ODTS shown in FIG. 3.

The temperature information converting unit 22 includes an operation code generating unit 221, a driving unit 222, and a flag signal output unit 223.

The operation code generating unit 221 performs a preset operation between the measuring temperature code DIGITAL_CODE and a fuse signal FUSE_DATA in the normal mode or a second test code TEST_CODE2 in the test mode, thereby outputting an operation code OP_CODE. The driving unit 222 drives the operation code OP_CODE to thereby output the temperature information code TEMP_CODE and the update signal UPDATE informing an update of the temperature information code TEMP_CODE in response to the internal update signal IN_UPDATE or the external update signal OUT_UPDATE. The flag signal output unit 223 determines and outputs each voltage level of the plurality of flag signals TRIP_POINT_FLAG<0:M> in response to the operation code OP_CODE.

In detail, the operation code generating unit 221 includes a code converter 224, a second multiplexer 225, and an operation unit 226.

The code converter 224 converts the measuring temperature code DIGITAL_CODE into a two's complement form. The second multiplexer 225 selects one of the fuse signal FUSE_DATA and the second test code TEST_CODE2 in response to the test mode signal TEST_MODE outputted from the operation controlling unit 23. The operation unit 226 receives an output of the code converter 224 as a first input and an output of the second multiplexer 225 as a second input and performs a preset operation to generate the operation code OP_CODE.

For reference, the second test code TEST_CODE2 is a preset digital value within the temperature information converting unit 22. Namely, the second test code TEST_CODE2 set by a user is determined according to test conditions so as to be stored within the temperature information converting unit 22. The fuse signal FUSE_DATA is also a preset digital value within the temperature information converting unit 22, and the value can be changed by a fuse option.

For example, if the measuring temperature code DIGITAL_CODE has an error so as to be inputted to the code converter 224 with a value of 80° C. though the actual internal temperature of the semiconductor device is 85° C., the operation code generating unit 221 operates as follows.

First, in the test mode, if the test mode signal TEST_MODE is activated and inputted to the second multiplexer 225, the second multiplexer 225 outputs the second test code TEST_CODE2 to the operation unit 226. At this time, the second test code TEST_CODE2 has a value corresponding to a value of 85° C. because the internal temperature of the semiconductor device is 85° C.

Second, the operation unit 226 outputs a value of −5 by performing an operation of +80−(+85).

Third, the fuse signal FUSE_DATA has a value of −5.

Fourth, in the normal mode, if the test mode signal TEST_MODE is inactivated and inputted to the second multiplexer 225, the second multiplexer 225 outputs the fuse signal FUSE_DATA to the operation unit 226. At this time, the operation unit 226 outputs a value of +85 by performing an operation of +80−(−5) because the fuse signal FUSE_DATA has the value of −5. Accordingly, the error of the measuring temperature code DIGITAL_CODE can be removed.

The driving unit 222 includes an OR gate OR2 and a driver 227. The OR gate OR2 performs an OR operation on the internal update signal IN_UPDATE and the external update signal OUT_UPDATE. The driver 227 drives the temperature information code TEMP_CODE and the update signal UPDATE by receiving an output of the OR gate OR2 and the operation code.

The flag signal output unit 223 outputs the plurality of flag signals TRIP_POINT_FLAG<0:M> whose logic levels change according to the internal temperature of the semiconductor device. That is, as the internal temperature increases, relatively more flag signals change to a logic high level.

FIG. 9 is a timing diagram illustrating a relationship between the plurality of flag signals TRIP_POINT_FLAG<0:M> outputted from the flag signal output unit 223 shown in FIG. 8 and the self-refresh oscillation signal SELF_REFREFH_OSC.

As shown in FIG. 9, the logic levels of the plurality of flag signals TEMP A, TEMP B and TEMP C change according to the internal temperature. As the internal temperature increases, relatively more flag signals change to a logic high level.

Accordingly as the logic level of the plurality of flag signals TEMP A, TEMP B and TEMP C change, the period of the self-refresh oscillation signal SELF_REFRESH_OSC changes.

As described above, in accordance with the preferred embodiment of the present invention, the ODTS operates independently of the impedance matching unit. As a result, each of the ODTS and the impedance matching unit can operate according to an optimized period.

In accordance with the preferred embodiment of the present invention, the ODTS updates temperature information according to a refresh period so that an update of the temperature information can be independent of the outside. Accordingly, it is possible to flexibly operate the ODTS because the update of the temperature information can be independent of the outside.

While the present invention has been respect to the specific embodiments, it will be apparent to those skilled in the art that various changes and modifications may be made without departing from the spirit and scope of the invention as defined in the following claims.

What is claimed is:

1. An on die thermal sensor (ODTS) for use in a semiconductor device, comprising:
a temperature information output unit for measuring an internal temperature of the semiconductor device to generate a temperature information code having temperature information, and updating the temperature information code in response to an external update signal based on a refresh period, wherein the temperature information output unit includes:
an external update signal output unit for outputting the external update signal in response to a refresh command signal in a normal mode and outputting the external update signal in response to a self-refresh oscillation signal in a self-refresh mode, wherein the external update signal output unit includes a logic gate for performing an OR operation on the refresh command signal and the self-refresh oscillation signal and the external update signal is produced in response to an output of the logic gate.

2. The ODTS as recited in claim 1, wherein the temperature information output unit further includes:
a temperature information code generation unit for generating the temperature information code and a plurality of flag signals by measuring the internal temperature of the semiconductor device,
wherein the temperature information code generation unit updates the temperature information code in response to the external update signal.

3. The ODTS as recited in claim 2, wherein the temperature information code indicates the measured temperature as a binary code with a sign and each of the plurality of flag signals varies according to the measured temperature.

4. The ODTS as recited in claim 3, wherein a period of the refresh command signal varies according to the temperature information code.

5. The ODTS as recited in claim 3, wherein a period of the self-refresh oscillation signal varies according to the number of activated ones of the flag signals.

6. The ODTS as recited in claim 1, wherein the external update signal output unit further includes:
a divider for dividing an input period of the output of the logic gate;
a delay for delaying an output of the divider; and
an external update signal generation unit for generating the external update signal in response to an output of the delay.

7. The ODTS as recited in claim 6, wherein the logic gate includes an OR gate for performing the OR operation on the refresh command signal and the self-refresh oscillation signal.

8. The ODTS as recited in claim 3, wherein the temperature information code generation unit includes:
a temperature measuring unit for measuring the internal temperature of the semiconductor device to output a measuring temperature code having information relating to the measured temperature, and an internal update signal informing an update of the measuring temperature code;
a temperature information converting unit for performing a preset operation to convert the measuring temperature code into the temperature information code and the plurality of flag signals and output the temperature information code with an update signal in response to the internal update signal or the external update signal; and
an operation controlling unit for generating an operating control signal to control an operating mode of the temperature measuring unit and generating a test mode signal to control an operating mode of the temperature information converting unit.

9. The ODTS as recited in claim 8, wherein the temperature measuring unit includes:
a temperature sensing unit for generating a temperature voltage and first and second variation voltages, wherein the temperature voltage decreases as the internal temperature increases, and each of the first and second variation voltages has a constant voltage level regardless of a temperature variation; and
an analog-to-digital converting unit for converting the temperature voltage having an analog value and outputting the measuring temperature code having a digital value and the internal update signal in response to the first and second variation voltages.

10. The ODTS as recited in claim 9, wherein the temperature sensing unit includes:
a voltage amplifying unit for amplifying a first base-emitter voltage to output the temperature voltage, wherein a first base-emitter voltage is in proportion to a first emitter current of a first bipolar junction transistor (BJT) and decreases as the internal temperature increases;
a current generating unit for generating a first current which increases as the internal temperature increases and a second current which decreases as the internal temperature increases;
a reference voltage generating unit for generating a reference voltage which has a constant voltage level regardless of temperature variation and is in proportion to a third current generated by summing the first and second current with a preset ratio; and
a voltage level adjusting unit for determining voltage levels of the first and second variation voltages by adjusting a voltage level of the reference voltage in response to an adjusting code.

11. The ODTS as recited in claim 10, wherein the voltage amplifying unit includes:
a differential amplifier for receiving the first base-emitter voltage as a negative input and a first dividing voltage as a positive input to amplify and output the inputs;
a driver for driving the temperature voltage in response to an output of the differential amplifier; and
a divider for dividing a voltage level of the temperature voltage by a preset value to thereby determine a voltage level of the first dividing voltage.

12. The ODTS as recited in claim 11, wherein the driver includes a PMOS transistor for driving its drain with a power supply voltage coupled to its source to provide the temperature voltage at the drain in response to the output of the differential amplifier coupled to its gate.

13. The ODTS as recited in claim 11, wherein the divider includes first and second resistors having preset resistances between a temperature voltage output node and a ground voltage, wherein the first dividing voltage is outputted at a common node of the first and second resistors.

14. The ODTS as recited in claim 10, wherein the current generating unit includes:
a first current generating unit for generating the first current by providing a first resistor having a preset resistance with the first base-emitter voltage; and a second current generating unit for forming a cascade connection with the first current generating unit and generating the second current by providing a second resistor having a preset resistance with a second base-emitter voltage in proportion to a second emitter current of a second BJT, wherein the first emitter current is multiple times larger than the second emitter current in magnitude.

15. The ODTS as recited in claim 10, wherein the reference voltage generating unit generates the reference voltage by providing a resistor having a preset resistance with the third current generated by summing a current that is M times larger than the first current and a current that is N times larger than the second current and M and N are integers.

16. The ODTS as recited in claim 10, wherein the voltage level adjusting unit includes:
 a first adjusting unit for outputting an adjusting reference voltage by adjusting the voltage level of the reference voltage; and
 a second adjusting unit for outputting the first and second variation voltages by adjusting the voltage level of the adjusting reference voltage,
 wherein each voltage level of the adjusting reference voltage and the first and second variation voltages is determined according to the adjusting code.

17. The ODTS as recited in claim 16, wherein the voltage level adjusting unit further includes an adjusting code register for storing the adjusting code to transmit them to the first and second adjusting units.

18. The ODTS as recited in claim 16, wherein the voltage levels of the first and second variation voltages have a constant difference.

19. The ODTS as recited in claim 16, wherein the first adjusting unit includes:
 a differential amplifier for receiving the reference voltage as a negative input and a second dividing voltage as a positive input to amplify and output a difference in the inputs;
 a driver for driving the adjusting reference voltage in response to an output of the differential amplifier; and
 a divider for dividing the voltage level of the adjusting reference voltage by a preset value to thereby determine a voltage level of the second dividing voltage.

20. The ODTS as recited in claim 19, wherein the driver includes a PMOS transistor for driving a power supply voltage coupled to its source to its drain as the adjusting reference voltage in response to the output of the differential amplifier coupled to its gate.

21. The ODTS as recited in claim 19, wherein the divider includes a variable resistor having a variable resistance according to the adjusting code, and a first resistor having a preset resistance between an adjusting reference voltage output node and a ground voltage, wherein the second dividing voltage is outputted at a common node of the variable resistor and the first resistor.

22. The ODTS as recited in claim 21, wherein the variable resistor includes:
 a plurality of resistors, each resistor being connected in series and having a preset resistance; and
 a plurality of switches, each switch connected with a corresponding one of the resistors in parallel and being controlled according to the adjusting code.

23. The ODTS as recited in claim 16, wherein the second adjusting unit includes:

a differential amplifier for receiving the adjusting reference voltage as a negative input and a third dividing voltage as a positive input to amplify and output a difference in the inputs;
a driver for driving the first variation voltage in response to an output of the differential amplifier; and
a divider for dividing the voltage level of the first variation voltage by a preset value to thereby determine voltage levels of the second variation voltage and the third dividing voltage.

24. The ODTS as recited in claim 23, wherein the driver includes a PMOS transistor for driving its drain with a power supply voltage coupled to its source and provide the first variation voltage at the drain in response to the output of the differential amplifier coupled to its gate.

25. The ODTS as recited in claim 23, wherein the divider includes first and second variable resistors having variable resistances according to the adjusting code, and a first resistor having a preset resistance between a first variation voltage output node and a ground voltage, wherein the second variation voltage is outputted at a common node of the first and second variable resistors, and the third dividing voltage is outputted at a common node of the second variable resistor and the first resistor.

26. The ODTS as recited in claim 25, wherein each of the first and second variable resistors includes:
 a plurality of resistors, each resistor being connected in series and having a preset resistance; and
 a plurality of switches, each switch connected with a corresponding one of the resistors in parallel and being controlled according to the adjusting code.

27. The ODTS as recited in claim 10, wherein the adjusting code is a feedback signal of the measuring temperature code in a test mode, and is a fuse code in the normal mode and the self-refresh mode.

28. The ODTS as recited in claim 9, wherein the analog-to-digital converting unit includes:
 a clock oscillation unit for oscillating a clock signal in response to the operating control signal outputted from the operation controlling unit;
 a comparison unit for comparing the voltage level of the temperature voltage with that of a tracking voltage and decreasing or increasing the measuring temperature code according to the comparison result to output the decreased or increased measuring temperature code with the internal update signal under the control of the clock signal; and
 a voltage level determination unit for determining the voltage level of the tracking voltage based on the measuring temperature code in the normal mode or a first test code in a test mode,
 wherein the voltage level of the tracking voltage is lower than that of the first variation voltage and is higher than that of the second variation voltage.

29. The ODTS as recited in claim 28, wherein the comparison unit includes:
 a comparator for comparing the voltage level of the temperature voltage with that of the tracking voltage in response to the clock signal so as to determine an increase signal and a decrease signal under the control of the compared result;
 an up-down counter for decreasing or increasing the measuring temperature code according to the increase signal and the decrease signal under the control of a first delay clock generated by delaying the clock signal by a predetermined time; and an internal update signal output unit for delaying the clock signal by a preset time to output the internal update signal.

30. The ODTS as recited in claim 29, wherein the comparison unit further includes a filtering unit for filtering the increase and the decrease signals in order to prevent the up/down counter from performing a wrong operation.

31. The ODTS as recited in claim 28, wherein the voltage level determination includes:
   a digital-to-analog converter (DAC) for converting an adjusted information code having a digital value into the tracking voltage having an analog value in response to the first and second variation voltages;
   a multiplexer for selecting the measuring temperature code in the normal mode and the first test code in the test mode in response to the test mode signal outputted from the operation controlling unit; and
   a decoder for decoding outputs of the multiplexer to transmit the adjusted information code to the DAC.

32. The ODTS as recited in claim 31, wherein the DAC includes:
   a first bias determination unit for determining a voltage level of a first bias voltage by comparing a first output voltage with the first variation voltage, wherein the voltage level of the first output voltage is controlled by the voltage level of the first bias voltage;
   a second bias determination unit for determining a voltage level of a second bias voltage by comparing a second output voltage with the second variation voltage, wherein the voltage level of the second output voltage is controlled by the voltage level of the second bias voltage; and
   a tracking voltage output unit, enabled under the control of the adjusted information code, for determining the voltage level of the tracking voltage based on the first and second bias voltages.

33. The ODTS as recited in claim 32, wherein the first bias determination unit includes:
   a current mirror circuit for determining the voltage level of the first output voltage based on the first bias voltage; and
   a comparator for outputting the first bias voltage by comparing the first output voltage with the first variation voltage.

34. The ODTS as recited in claim 32, wherein the second bias determination unit includes:
   a current mirror circuit for determining the voltage level of the second output voltage based on the second bias voltage; and
   a comparator for outputting the second bias voltage by comparing the second output voltage with the second variation voltage.

35. The ODTS as recited in claim 32, wherein the tracking voltage output unit includes a current mirror circuit which is enabled under the control of the adjusted information code and determines the voltage level of the tracking voltage based on the first and second bias voltages.

36. The ODTS as recited in claim 8, wherein the temperature information converting unit includes:
   an operation code generating unit for performing a preset operation on the measuring temperature code and a fuse signal in the normal mode or a second test code in a test mode, and outputting an operation code;
   a driving unit for driving the operation code and outputting the temperature information code and the update signal informing an update of the temperature information code in response to the internal update signal or the external update signal; and
   a flag signal output unit for determining the plurality of flag signals in response to the operation code.

37. The ODTS as recited in claim 36, wherein the operation code generating unit includes:
   a code converter for converting the measuring temperature code into a two's complement form;
   a multiplexer for selecting one of the fuse signal and the second test code in response to the test mode signal outputted from the operation controlling unit; and
   an operation unit for receiving outputs of the code converter and the multiplexer and performing a preset operation to generate the operation code OP_SODE.

38. The ODTS as recited in claim 36, wherein the driving unit includes:
   an OR gate for performing an OR operation to the internal update signal and the external update signal; and
   a driver for driving the temperature information code and the update signal by receiving an output of the OR gate and the operation code.

39. The ODTS as recited in claim 36, wherein the flag signal output unit controls more flag signals to be a logic high level as the internal temperature of the semiconductor device increases.

40. The ODTS as recited in claim 8, wherein the operation controlling unit receives an enable signal, a test mode enable signal, and a self-refresh signal from external so as to generate the operating control signal and the test mode signal, wherein the enable signal controls an entry of the normal mode, the test mode enable signal controls an entry of a test mode, and the self-refresh signal controls an entry of the self-refresh mode.

41. A semiconductor device, comprising:
   a temperature information output unit for measuring an internal temperature of the semiconductor device to generate a temperature information code and a plurality of flag signals, and updating the temperature information code in response to an external update signal, wherein the temperature information output unit includes an external update signal output unit for outputting the external update signal based on a refresh command signal in a normal mode and outputting the external update signal based on a self-refresh oscillation signal in a self-refresh mode and the external update signal output unit includes a logic gate for performing an OR operation on the refresh command signal and the self-refresh oscillation signal and the external update signal is produced in response to an output of the logic gate;
   a code storage unit for storing the temperature information code when the temperature information code is updated;
   a memory controller for changing a period of the refresh command signal by reading the temperature information code stored in the code storage unit; and
   a self-refresh oscillation unit for changing a period of the self-refresh oscillation signal in response to the plurality of flag signals.

42. The semiconductor device as recited in claim 41, wherein the temperature information code indicates the measured temperature as a binary code, and the plurality of flag signals vary according to the measured temperature.

43. The semiconductor device as recited in claim 42, wherein the temperature information output unit further includes:
   a temperature measuring unit for measuring the internal temperature of the semiconductor device to output a measuring temperature code having information relating to the measured temperature, and an internal update signal informing an update of the measuring temperature code;

a temperature information converting unit for performing a preset operation to convert the measuring temperature code into the temperature information code and the plurality of flag signals and outputting the temperature information code with an update signal in response to the internal update signal or the external update signal; and an operation controlling unit for generating an operating control signal to control an operating mode of the temperature measuring unit and generating a test mode signal to control an operating mode of the temperature information converting unit.

44. The semiconductor device as recited in claim 43, wherein the temperature measuring unit includes:

a temperature sensing unit for generating a temperature voltage and first and second variation voltages, wherein the temperature voltage decreases as the internal temperature increases, and each of the first and second variation voltages has a constant voltage level regardless of a temperature variation; and an analog-to-digital converting unit for converting the temperature voltage having an analog value and outputting the measuring temperature code having a digital value and the internal update signal in response to the first and second variation voltages.

45. The semiconductor device as recited in claim 41, wherein the external update signal output unit includes:

a divider for dividing an input period of the output of the logic gate; and a delay for delaying an output of the divider to output the external update signal.

46. The semiconductor device as recited in claim 45, wherein the logic gate includes an OR gate for performing the OR operation on the refresh command signal and the self-refresh oscillation signal.

47. The semiconductor device as recited in claim 43, wherein the operation controlling unit receives an enable signal, a test mode enable signal, and a self-refresh signal from external so as to generate the operating control signal and the test mode signal, wherein the enable signal controls an entry of the normal mode, the test mode enable signal controls an entry of a test mode, and the self-refresh signal controls an entry of the self-refresh mode.

48. The semiconductor device as recited in claim 42, wherein the code storage unit includes a register for receiving the update signal as a first input and the temperature information code as a second input so as to store the temperature information code when the update signal is activated.

49. The semiconductor device as recited in claim 41, wherein the memory controller reads the temperature information code stored in the code storage unit and changes the period of the refresh command signal when the temperature information code varies.

50. The semiconductor device as recited in claim 41, wherein the self-refresh oscillation unit changes the period of the self-refresh oscillation signal according to the number of activated ones of the plurality of flag signals.

51. The semiconductor device as recited in claim 50, wherein the self-refresh oscillation unit increases the period of the self-refresh oscillation signal as the number of activated ones of the plurality of flag signals decreases.

52. The semiconductor device as recited in claim 50, wherein the self-refresh oscillation unit decreases the period of the self-refresh oscillation signal as the number of activated ones of the plurality of flag signals increases.

* * * * *